(12) United States Patent
Kim

(10) Patent No.: US 6,566,920 B1
(45) Date of Patent: May 20, 2003

(54) PHASE LOCKED LOOP USING LOCK DETECTING CIRCUIT

(75) Inventor: Young-Soo Kim, Seoul (KR)

(73) Assignee: Hyundai Electronics Industries Co., Ltd., Kyounki-Do (KR)

( * ) Notice: Subject to any disclaimer, the term of this patent is extended or adjusted under 35 U.S.C. 154(b) by 0 days.

(21) Appl. No.: 09/285,887

(22) Filed: Apr. 7, 1999

(30) Foreign Application Priority Data

Dec. 17, 1998 (KR) ............................................ 98-55694

(51) Int. Cl.[7] ................................................ H03L 7/06
(52) U.S. Cl. ...................... 327/147; 375/374; 327/147; 327/148; 327/156; 327/157
(58) Field of Search ................................ 375/376, 371, 375/373, 374, 375, 294, 327, 360; 331/11, 17, 18, 20, 1 A, 1 R, 12; 327/147, 148, 155, 156, 157, 12, 236; 329/325, 326

(56) References Cited

U.S. PATENT DOCUMENTS

| | | | | |
|---|---|---|---|---|
| 5,347,233 A | * | 9/1994 | Ishibashi et al. | 331/2 |
| 5,699,020 A | * | 12/1997 | Jefferson | 331/17 |
| 5,821,818 A | * | 10/1998 | Idei et al. | 331/17 |
| 6,043,695 A | * | 3/2000 | O'Sullivan | 327/157 |
| 6,140,881 A | * | 10/2000 | Kim | 331/20 |

* cited by examiner

Primary Examiner—Shuwang Liu
(74) Attorney, Agent, or Firm—Morgan, Lewis & Bockius LLP

(57) ABSTRACT

A PLL (phase locked loop) using a lock detecting circuit includes a phase frequency detector detecting the phase of an input signal and outputting an up signal and a down signal, a lock detecting circuit detecting whether the PLL is locked using the up and down signals, a charge pump pumping the up signal and the down signal, first and second voltage dividers respectively receiving the output signal of the charge pump, first and second switches controlling the output signals of the first and second voltage dividers using the output signal of the lock detecting circuit and selectively outputting the result values, a capacitor connected between an output terminal connected in common to the first and second transmission gates and ground voltage, and a voltage controlled oscillator feeding back the output signals of the first and second switches to the phase frequency detector. The PLL improves the noise tracing capability and noise characteristics and the lock detecting circuit has a simple logic circuit to decrease the locked-in time, thereby decreasing chip area and improving integration.

11 Claims, 3 Drawing Sheets

PHASE LOCKED LOOP USING LOCK DETECTING CIRCUIT

BACKGROUND OF THE INVENTION

1. Field of the Invention

The present invention relates to a PLL (phase locked loop) using a lock detecting circuit, and more particularly, to an improved PLL using a lock detecting circuit capable of decreasing the delay of jitter noise and locked-in time serving as two characteristics of PLL trade-off, thereby decreasing chip area with a simplified logic circuit of the lock detecting circuit without using an additional phase detection.

2. Description of the Background Art

FIG. 1 is a block diagram illustrating a conventional PLL circuit. As shown therein, the PLL includes a main phase detector 1 detecting the phase of an input signal IN, a loop filter 2 receiving an output signal $\sin\theta e$ of the main phase detector 1 and decreasing a noise bandwidth or shortening a locked-in time, a lock indicator 3 receiving the input signal IN and outputting an output signal to the loop filter 2, and a voltage controlled oscillator (VCO) 4 feeding back the output of the loop filter 2 to the phase detector 1 and the lock indicator 3.

The lock indicator 3 includes a phase converter 3-1 converting the phase of the output signal of the voltage controller oscillator 4 by 90°, a quad phase detector 3-2 converting the input signal IN and the output of the phase converter 3-1 to a cosine signal $\cos\theta e$, and a smoothing filter 3-3 smoothing the output of the quad phase detector 3-2.

FIG. 2 is a circuit view detailing the loop filter 2 in FIG. 1. As shown therein, the loop filter 2 includes a low resistor LR having a low resistance value and a high resistor HR having a high resistance value wherein the output of the phase detector 1 is applied to each terminal thereof, a three-phase switch SW controlled by the output signal of the smoothing filter 3-3 in the lock indicator 3 and selectively connected to the other terminals of the resistors LR, HR, and a capacitor C connected between the output terminal of the three-phase switch SW and the ground voltage.

The operation of the thusly constituted conventional PLL will now be described with reference to the accompanying drawings.

First, when the input signal IN is applied to the PLL, the main phase detector 1 detects the phase of the input signal IN and outputs the sine signal $\sin\theta e$ to the loop filter 2.

At this time, the input signal IN is applied to the quad phase detector 3-2 of the lock indicator 3 which then outputs the cosine signal $\cos\theta e$ to the smoothing filter 3-3.

Accordingly, when the PLL is locked, $\theta e$ of the cosine signal $\cos\theta e$ of the quad phase detector 3-2 becomes 0° so that the cosine output $\cos\theta e$ becomes 1. That is, since the cosine output becomes 1, the three-phase switch SW of the loop filter 2 is connected to the high resistance HR in accordance with the output of the smoothing filter 3-3.

To the contrary, when the PLL is not locked, $\theta e$ of the cosine signal $\cos\theta e$ 3-2 becomes 90° so that the cosine output $\cos\theta e$ becomes 0. That is, since the cosine output becomes 0, the three-phase switch SW of the loop filter 2 is connected to the low resistor LR in accordance with the output of the smoothing filter 3-3.

More specifically, the smaller the noise bandwidth of the PLL, the better becomes the signal-to-noise ratio (SNR), and accordingly when the PLL is not locked the three-phase switch SW of the loop filter 2 is connected to the low resistor LR so as to decrease the noise bandwidth. When locked, the three-phase switch SW should be connected to the high resistor so as to shorten the locked-in time.

However, the conventional PLL additionally requires the quad phase detector 3-2 for controlling such a switching operation, thereby disadvantageously increasing the chip area.

SUMMARY OF THE INVENTION

The present invention is directed to overcoming disadvantages of the conventional PLL.

Therefore, it is an object of the present invention to provide a PLL using a lock detecting circuit capable of shortening a locked-in time while decreasing a chip area, thereby improving noise characteristics.

To achieve the above-described object, there is provided a PLL using a lock detecting circuit according to the present invention which includes a phase frequency detector detecting the phase of an input signal and outputting an up signal and a down signal, a lock detecting circuit detecting whether the PLL is locked using the up and down signals, a charge pump pumping the up signal and the down signal, first and second voltage dividers respectively receiving the output signal of the charge pump, first and second switching means controlling the output signals of the first and second voltage dividers using the output signal of the lock detecting circuit and selectively outputting the result values, a capacitor connected between an output terminal connected in common to the first and second switching means and ground voltage, and a voltage controlled oscillator feeding back the output signals of the first and second switching means to the phase frequency detector.

The features and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
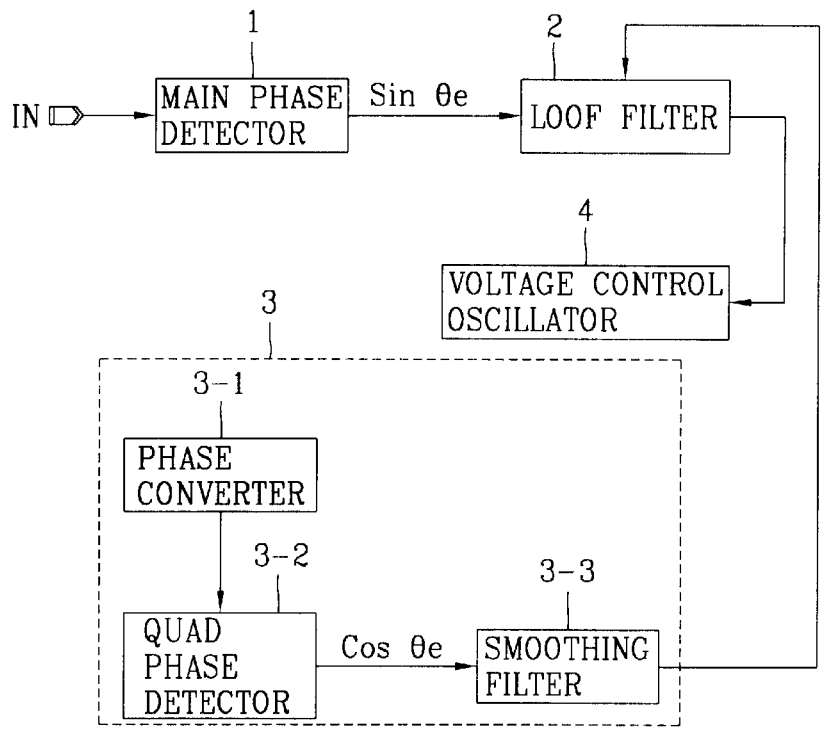
FIG. 1 is a block diagram illustrating a conventional PLL.
Figure 2:
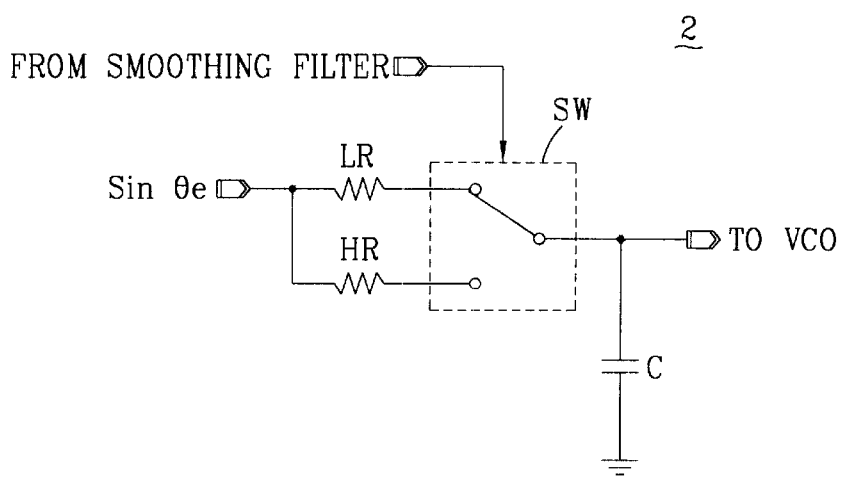
FIG. 2 is a circuit view detailing a loop filter in FIG. 1.
Figure 3:
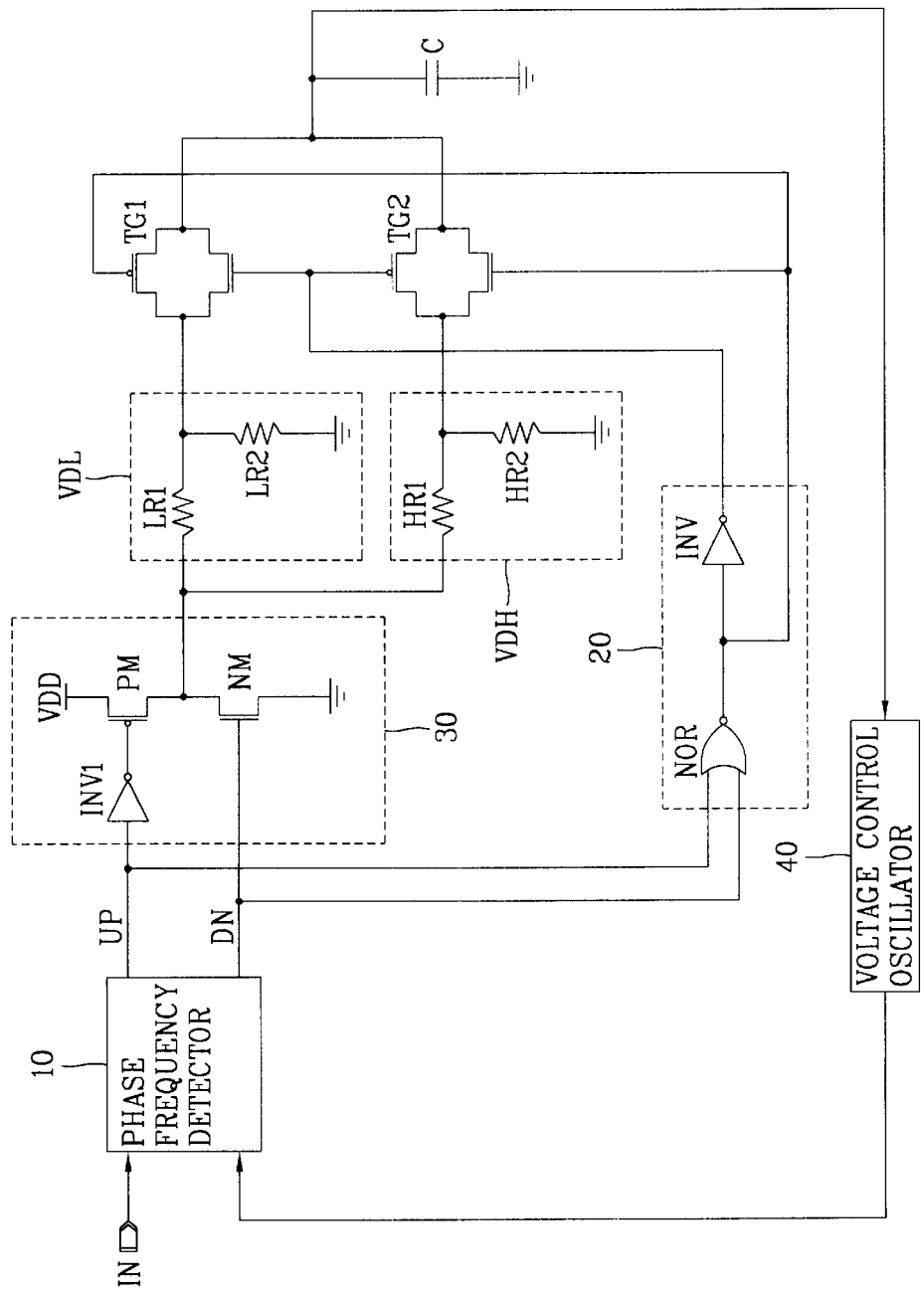
FIG. 3 is a circuit view illustrating a PLL using a lock detecting circuit according to a preferred embodiment of the present invention.

FIG. 3 is a circuit view illustrating a PLL using a lock detecting circuit according to the present invention. As shown therein, the PLL circuit includes a phase frequency detector 10 detecting the phase of an input signal IN and outputting an up signal UP and a down signal DN for frequency tracing, a lock detecting circuit 20 detecting whether the PLL is locked using the up and down signals UP, DN from the phase frequency detector 10, a charge pump 30 pumping the up signal UP and the down signal DN from the phase frequency detector 10, first and second voltage dividers VDL, VDH receiving the output signal pumped by the charge pump 30, first and second transmission gates TG1, TG2 controlled in accordance with the output of the lock detecting circuit 20 and selectively switching the respective output signals of the first and second voltage dividers VDL, VDH, a capacitor C connected between an output terminal connected in common to the first and second transmission gates TG1, TG2 and the ground voltage, and a voltage controlled oscillator 40 feeding back the output of the first transmission gate TG1 or the second transmission gate TG2 to the phase frequency detector 10.

The lock detecting circuit 20 includes a NOR gate NOR for NORing the up signal UP and the down signal DN from the phase frequency detector 10, and an inverter INV for inverting the output of the NOR gate NOR.

The charge pump 30 includes an inverter INV1 for inverting the up signal UP, and a PMOS transistor PM and an NMOS transistor NM connected between s source voltage VDD and a ground voltage and having their gates respectively connected to the output of the inverter INV1 and the down signal DN and their drains connected to each other, so that an output signal is outputted from between the drains of the transistors PM, NM.

The first voltage divider VDL includes a first resistor LR1 connected to an output terminal of the charge pump 30, and a second resistor LR2 connected between a terminal of the first resistor LR1 and the ground voltage, so that an output signal is outputted from the common terminal between the first resistor LR1 and the second resistor LR2. Here, a low impedance resistance is used for the first resistor LR1 and the second resistor LR2.

The second voltage divider VDH is identical to the first voltage divider VDL in construction but a resistance having a large impedance is employed for the first and second resistors HR1, HR2 for forming the second voltage divider VDH.

The operation of the thusly constituted PLL using a lock detecting circuit will now be described.

First, the phase frequency detector 10 detects the phase of the input signal IN and outputs an up signal UP and a down signal DN to lock the PLL against the input signal IN in accordance with the output of the voltage controlled oscillator 40.

The charge pump 30 pumps the up signal UP and the down signal DN to the voltage dividers VDL, VDH. At this time, the respective output signals of the first voltage divider VDL using a low impedance resistance and of the second voltage divider VDH using a high impedance resistance are selectively switched by the first and second transmission gates TG1, TG2 which are controlled by the output signal of the NOR gate NOR of the lock detecting circuit 20 which has NORed the up signal UP and down signal DN and by the signal inverted by the inverter INV which has received the output signal of the NOR gate NOR.

Therefore, when the up signal UP and the down signal DN have different values, that is, during a frequency tracing process, the output signal of the NOR gate NOR in the lock detecting circuit 20 becomes a "low" level and accordingly the second transmission gate TG2 is turned off and only the first transmission gate TG1 is turned on, so that the first voltage divider VDL using the low impedance resistance is connected to the capacitor C, thereby decreasing the noise bandwidth and enhancing the frequency tracing capability.

Meanwhile, when the up signal UP and the down signal DN are all "0", that is, when the PLL is locked at the input frequency, the output signal of the NOR gate NOR in the lock detecting circuit 20 becomes a high level so that the first transmission gate TG1 is turned off and only the second transmission gate TG2 is turned on so as to enable the second voltage divider VDH using a high impedance resistance to be connected to the capacitor C, thereby decreasing the locked-in time.

Here, the resistance LR having a low impedance and the resistance HR having a high impedance are commonly used. This is because the time required to trace the frequency of the PLL and lock the PLL and the signal-to-noise rate of the PLL are in a trade-off relation.

Assuming the noise bandwidth is $B_L$, $$B_L = W3 \text{ dB}/4$$

is satisfied, and

W3 dB+KdKoKh=K, wherein Kd denotes the gain of a phase frequency comparator, Ko denotes the gain of the voltage controlled oscillator, and Kh denotes the gain of a loop filter.

Also, with regard to the gain of the loop filter $$Kh = R2/R1 + R2$$

is satisfied, wherein R1, R2 respectively represent a low impedance resistance and a high impedance resistance, and the less the loop filter gain Kh, the better become the noise characteristics.

However, assuming the pull-in time in which the PLL chases after the input frequency is "Tp", the pull-in time Tp is proportional to 1/K so that in order to decrease the pull-in time Tp the larger becomes the gain Kh of the loop filter, the better. That is, in a process in which the input frequency is chased, a lower impedance resistance is employed to increase the loop filter gain Kh. When the PLL is locked, the high impedance resistance is employed to decrease the loop filter gain Kh so as to improve the noise characteristics. At this time, in order to control the switching operation, the lock detecting circuit according to the present invention is employed.

The respective output signals of the first voltage divider VDL and the second voltage divider VDH selectively switched by the first and second transmission gates TG1, TG2 are fed back to the phase frequency detector 10 in accordance with the voltage controlled oscillator 40.

Here, the capacitor C is employed to remove the switching noise.

Therefore, the PLL at a steady-state increases the signal-to-noise rate SNR and accordingly the frequency tracing capability and the noise characteristics are improved.

Figure 4:
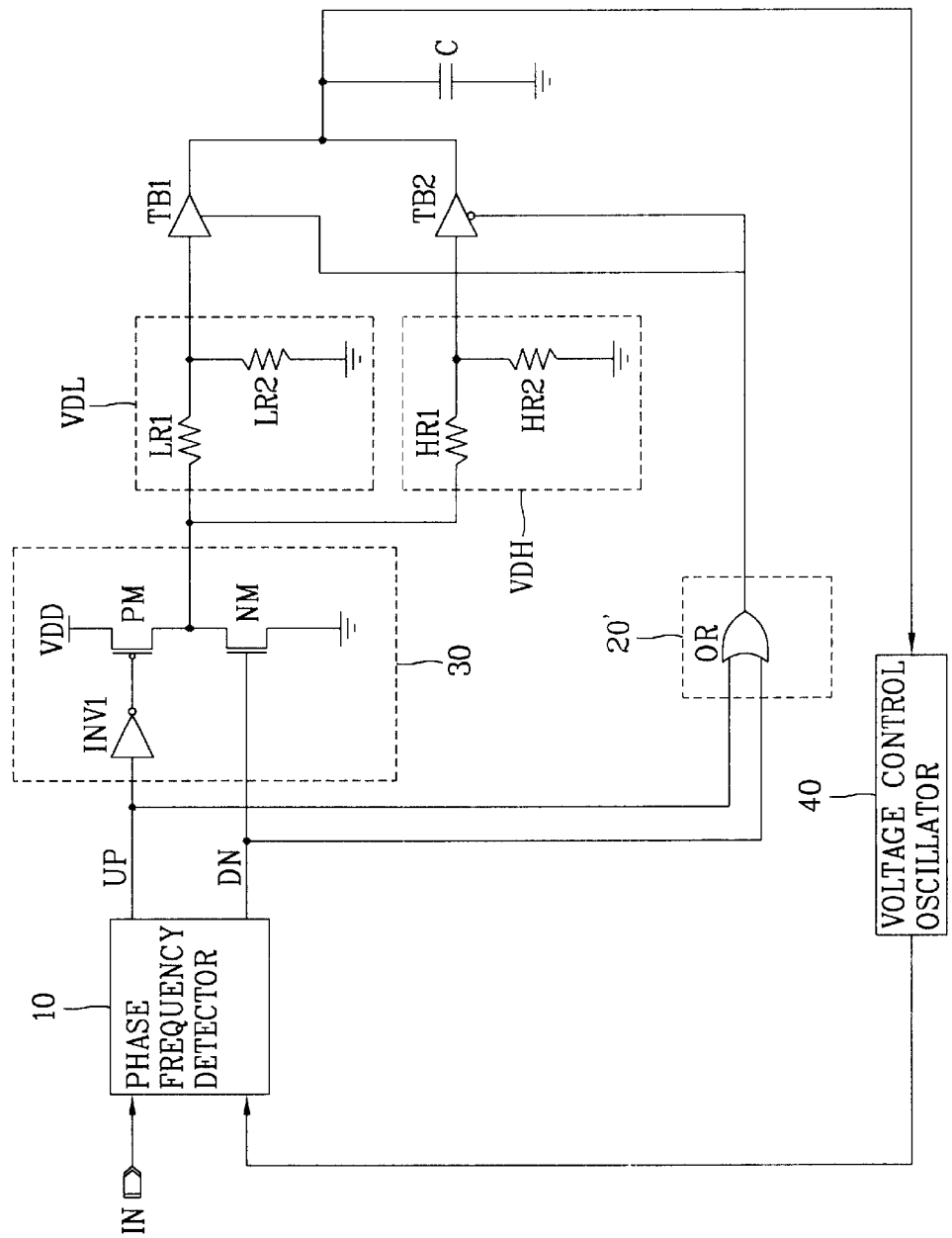
FIG. 4 is a circuit view illustrating a PLL using a lock detecting circuit according to another preferred embodiment of the present invention.

FIG. 4 is a block diagram illustrating the PLL using a lock detecting circuit according to another embodiment of the present invention, wherein the construction is similar to that of the first embodiment. As shown therein, the first and second three-phase buffers TB1, TB2 are employed instead of the first and second transmission gates TG1, TG2 serving as the first and second switching members. Accordingly, the lock detecting circuit 20' for controlling the first and second three-phase buffers TB1, TB2 includes an OR gate OR instead of the NOR gate NOR and the inverter INV used in the lock detecting circuit 20 according to the first embodiment of the present invention.

The operation of the second embodiment of the present invention is identical to that of the first embodiment except for the fact that the output signal of the OR gate OR is used to control the first and second three-phase buffers TB1, TB2 so that the description thereof will be omitted.

As described above, the PLL using a lock detecting circuit according to the present invention significantly improves the noise tracing capability and noise characteristics and the lock detecting circuit has a simple logic circuit to decrease the locked-in time, thereby decreasing chip area and improving integration.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A PLL (phase locked loop) comprising:
    a phase frequency detector detecting a phase of an input signal and outputting an up signal and a down signal;
    a lock detecting circuit detecting whether the PLL is locked using the up and down signals, the lock detecting circuit including a NOR gate for performing a logical NOR operation on the up signal and the down signal, and an inverter for inverting an output signal of the NOR gate;
    a charge pump pumping the up signal and the down signal;
    first and second voltage dividers respectively receiving an output signal of the charge pump;
    first and second switching means controlling output signals of the first and second voltage dividers, respectively, using an output signal of the lock detecting circuit and selectively outputting the output signals of the first and second voltage dividers;
    a capacitor connected between an output terminal connected in common to the first and second switching means and a ground voltage; and
    a voltage controlled oscillator feeding back a signal to the phase frequency detector based on the output signals of the first and second switching means.

2. The PLL of claim 1, wherein the first voltage divider comprises:
    a first resistor having a terminal thereof connected to an output terminal of the charge pump; and
    a second resistor connected between another terminal of the first resistor and a ground voltage.

3. The PLL of claim 2, wherein a low impedance resistance is used for the first and second resistors.

4. The PLL of claim 1, wherein the second voltage divider comprises:
    a first resistor having a terminal thereof connected to the output terminal of the charge pump; and
    a second resistor connected between another terminal of the first resistor and a ground voltage.

5. The PLL of claim 4, wherein a high impedance resistance is used for the first and second resistors.

6. The PLL of claim 1, wherein the first and second switching means respectively include a transmission gate.

7. A PLL (phase locked loop) comprising:
    a phase frequency detector detecting a phase of an input signal and outputting an up signal and a down signal;
    a lock detecting circuit detecting whether the PLL is locked using the up and down signals;
    the lock detecting circuit including an OR gate for performing a logical OR operation on the up signal and the down signal;
    a charge pump pumping the up signal and the down signal;
    first and second voltage dividers respectively receiving an output signal of the charge pump;
    a first three-phase buffer controlling and selectively outputting an output signal of the first voltage divider in accordance with an output signal of the lock detecting circuit;
    a second three-phase buffer controlling and selectively outputting an output signal of the second voltage divider in accordance with the output signal of the lock detecting circuit received at an inverter terminal of the second three-phase buffer;
    a capacitor connected between an output terminal connected in common to the first and second three-phase buffers and a ground voltage; and
    a voltage controlled oscillator feeding back a signal to the phase frequency detector based on the output signals of the first and second three-phase buffers.

8. The PLL of claim 7, wherein the first voltage divider comprises:
    a first resistor having a terminal thereof connected to an output terminal of the charge pump; and
    a second resistor connected between another terminal of the first resistor and a ground voltage.

9. The PLL of claim 8, wherein a low impedance resistance is used for the first and second resistors.

10. The PLL of claim 7, wherein the second voltage divider comprises:
    a first resistor having a terminal thereof connected to the output terminal of the charge pump; and
    a second resistor connected between another terminal of the first resistor and a ground voltage.

11. The PLL of claim 10, wherein a high impedance resistance is used for the first and second resistors.

* * * * *